(12) United States Patent
Raschbacher et al.

(10) Patent No.: US 11,422,201 B1
(45) Date of Patent: Aug. 23, 2022

(54) DEVICES AND METHODS FOR VOLTAGE SUPPLY MONITORING

(71) Applicant: NXP USA, Inc., Austin, TX (US)

(72) Inventors: Sebastian Raschbacher, Treuchtlingen (DE); Hubert Martin Bode, Haar (DE); Mark Lehmann, Munich (DE); Xianghua Shen, Unterhaching (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/205,056

(22) Filed: Mar. 18, 2021

(51) Int. Cl.
  *G01R 31/40* (2020.01)
  *G01R 19/10* (2006.01)
  *G05F 1/46* (2006.01)

(52) U.S. Cl.
  CPC ............ *G01R 31/40* (2013.01); *G01R 19/10* (2013.01); *G05F 1/46* (2013.01)

(58) Field of Classification Search
  CPC ............ G01R 31/40; G01R 19/10; G05F 1/46
  USPC .................................... 324/764.01, 537, 500
  See application file for complete search history.

(56) References Cited

U.S. PATENT DOCUMENTS

| | | | |
|---|---|---|---|
| 5,144,159 A | 9/1992 | Frisch et al. | |
| 6,686,782 B2 | 2/2004 | Kinoshita et al. | |
| 2017/0350942 A1* | 12/2017 | Kinsella | G01R 31/52 |
| 2018/0224494 A1* | 8/2018 | Iwanabe | G01R 31/64 |
| 2019/0137559 A1* | 5/2019 | Winter | G01R 31/085 |

* cited by examiner

*Primary Examiner* — Giovanni Astacio-Oquendo

(57) ABSTRACT

An integrated circuit, can comprise a first power supply terminal configured to supply a first voltage, a second power supply terminal configured to supply a second voltage, a first supply monitor including a detector having a first input and a second input, and configured to provide a fault indicator based on a comparison between the first and second inputs, and switching circuitry configured to during a normal operating mode, couple a voltage derived from the first voltage to the first input and a voltage derived from the second voltage to the second input, and during a self-test mode, couple the voltage derived from the second voltage to the first input and the voltage derived from the first voltage to the second input.

20 Claims, 2 Drawing Sheets

DEVICES AND METHODS FOR VOLTAGE SUPPLY MONITORING

BACKGROUND

Field

This disclosure relates generally to integrated circuit devices, and more specifically, to monitoring voltage supply to multiple processing devices.

Related Art

The term "System on a Chip" (SOC) is used to describe microcontrollers and microprocessors that include multiple devices and integrated circuits (ICs) in a single package. For example, an SOC can include one or more processor cores, sensors, memory devices, peripheral interfaces, and input/output interfaces to couple the SOC to external device(s). A single power source can be used to provide power to the SOC, however, there may be multiple interconnections between the power source and different circuitry in the SOC. For example, supply voltage can be provided to non-volatile memory via a first interconnect, to clock circuitry via a second interconnect, etc. The separate interconnects, for example bond wires, are typically external to the SOC to reduce crosstalk noise between the different circuitries.

Monitoring circuitry can be used to ensure that the supply voltage on the different interconnects is high enough for proper operation of the corresponding circuitry. It is important to ensure that the monitoring circuitry is operating correctly to ensure the appropriate level of power is provided to the different sections of circuitry.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of integrated circuitry and methods are disclosed herein that monitor supply voltage to multiple system on chips (SOCs) and/or circuitry that provides different functionalities within a single SOC that share the same source of supply voltage through interconnections such as bond wires external to the SOCs. The monitor indicates if the supply voltage level to secondary SOCs is above a certain fraction of the supply voltage to a primary SOC. During normal operation, the monitor circuitry will indicate good status when external interconnections are functional, resulting in equal supply levels for primary and secondary supply. In case of an error, such as, for example, a broken secondary supply bond wire, the monitor circuitry indicates an error status. Instead of requiring a high-precision monitor that requires trimming and testing for each externally connected primary and secondary supply, embodiments disclosed herein use only one high precision monitor on the primary supply to ensure correct absolute values. During self-test mode, the primary and secondary supply inputs of the detector can be interchanged, which changes the output state of the detector to show proper operation of the monitor circuitry. The self-test avoids requiring interconnection to an analog test bus to test proper functionality of the monitoring circuitry. Additionally, the self-test feature can be used in the field.

Figure 1:
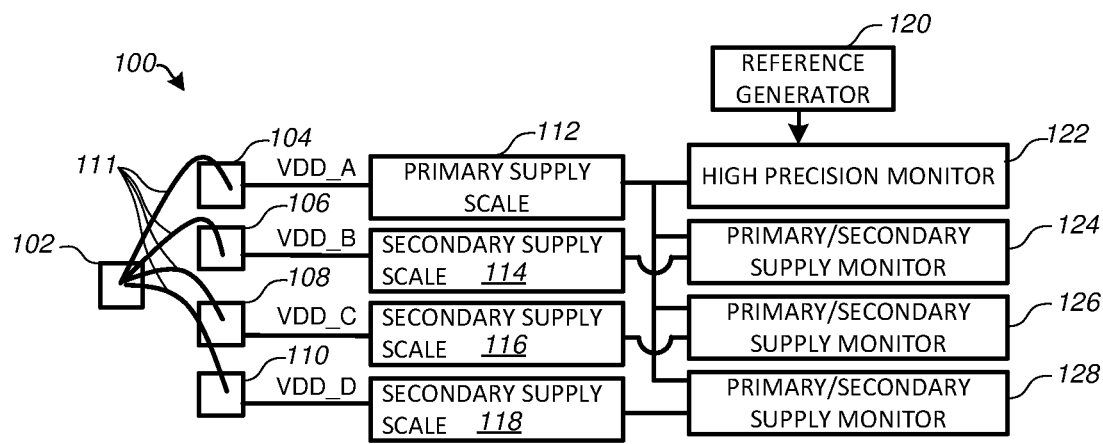
FIG. 1 illustrates a block diagram of components of a power management circuit in accordance with selected embodiments of the present invention.

FIG. 1 illustrates a block diagram of components of a power management circuit 100 in accordance with selected embodiments of the present invention. Power management circuit 100 includes electrically conductive pad 102 and separate interconnections or wirebonds 111 connected between conductive pad 102 and each of electrically conductive pads 104, 106, 108, 110. Source voltage is provided to conductive pad 102, which is then also provided to each of conductive pads 104-110 through the respective interconnections 111. An input to primary supply scale circuit 112 is connected to conductive pad 104 to receive supply voltage VDD_A through a respective conductive interconnect. Secondary supply scale circuit 114 includes an input connected to conductive pad 106 to receive supply voltage VDD_B through another respective conductive interconnect. An input to secondary supply scale circuit 116 is connected to conductive pad 108 to receive supply voltage VDD_C through another respective conductive interconnect. Secondary supply scale circuit 118 includes an input connected to conductive pad 110 to receive supply voltage VDD_D through another respective conductive interconnect. Supply voltages VDD_A, VDD_B, VDD_C and VDD_D can be supplied to respective functional circuitry on an SOC, such as memory devices, clock circuitry, etc., or to multiple SOCs.

Primary supply scale circuit 112 and secondary supply scale circuits 114, 116, 118, can apply a scale factor to respective supply voltages VDD_A, VDD_B, VDD_C and VDD_D. For example, during self-test mode, a scale factor can be applied by primary supply scale circuit 112 to reduce supply voltage VDD_A a predetermined percentage compared to supply voltages VDD_B, VDD_C and VDD_D. The reduction in supply voltage VDD_A causes a change in the output of primary/secondary supply monitor circuits 124, 126, 128, when the interconnections are primary/secondary supply monitor circuits 124-128 are swapped. If a change in the output is not detected by one or more of primary/secondary supply monitor circuits 124, 126, 128 during the transition/swap with VDD_A reduced below VDD_B, VDD_C and VDD_D, then a failure in the corresponding interconnection(s) may be indicated.

The scale factor provided by primary supply scale circuit 112 and secondary supply scale circuits 114-118 can be selected to determine whether supply voltages VDD_A, VDD_B, VDD_C and VDD_D are sufficient to provide the required level of voltage when the interconnections for VDD_A, VDD_B, VDD_C and VDD_D are properly connected. The scale factors can be implemented using any suitable electrical components, as further described herein. Any suitable configuration of resistive elements and/or other electrical components can be used to selectively scale supply voltages VDD_A, VDD_B, VDD_C and VDD_D by the same or different amounts. In some embodiments, the scaling circuitry may be bypassed if no scaling is required. In addition, VDD_B, VDD_C and VDD_D can be scaled to optimize the operating point of a subsequent detector circuit, as well as to scale supply voltages VDD_A, VDD_B, VDD_C and VDD_D to be within the operating supply voltage of primary/secondary supply monitor circuits 124, 126, 128. The primary supply voltage VDD_A or other suitable supply voltage can be used to power primary/secondary supply monitor circuits 124, 126, 128.

Primary supply scale circuit 112 includes an output coupled to an input of high precision monitor circuit 122, and to a first input of each of primary/secondary supply monitor circuits 124, 126 and 128. Reference generator circuit 120 provides a reference voltage to high precision monitor 122 to determine whether supply voltage VDD_A is sufficient to operate the integrated circuit in which power management circuit 100 is implemented. Both high precision monitor circuit 122 and primary/secondary supply monitor circuits 124, 126, 128 include a comparator that receives a voltage under test on one input and a reference voltage on the second input. One difference between high precision monitor circuit 122 and primary/secondary supply monitor circuits 124, 126, 128 is high precision monitor circuit 122 high precision monitor circuit 122 receives the reference voltage from a source that is rather stable over process, voltage, and temperature variations, for example, a trimmable bandgap integrated circuit. Primary/secondary supply monitor circuits 124, 126, 128 receive the reference voltage from the scaled down version of supply voltage VDD_A.

Secondary supply scale circuits 114, 116, 118 each have an output that is coupled to a second input of a corresponding one of primary/secondary supply monitor circuits 124, 126, 128. Secondary supply scale circuits 114, 116, 118 include circuitry that can reduce the level of the corresponding input supply voltages VDD_B, VDD_C and VDD_D to a desired level. Alternatively, the scale factor can be one (1) such that the output supply voltage is equal to the input supply voltage. Note that the scaling used in secondary supply scale circuits 114-118 can be different depending on the level of voltage required by the circuitry being powered by the particular supply voltages VDD_A, VDD_B, VDD_C and VDD_D. As an example, the scaling factor in primary supply scale circuit 112 can be at most 80%, and scaling factors in secondary supply scale circuits 114-118 can be at least 90%. Other suitable scale factors for primary and secondary supply scale circuits 112, 114-118 can be used, however.

In some systems, high precision monitor circuits 122 can be used to monitor each respective supply voltage VDD_A, VDD_B, VDD_C and VDD_D. However high precision monitor circuit 122 requires calibration and trimming and can create corner cases during power sequencing due to different trip levels. In other systems, only one high precision monitor circuit can be used to monitor a primary supply voltage, such as VDD_A, along with lower precision primary/secondary monitor circuits that monitor the difference between primary supply voltage VDD_A and corresponding secondary supply voltages VDD_B, VDD_C and VDD_D. Since supply voltages VDD_A, VDD_B, VDD_C and VDD_D are all driven by the same source, the primary/secondary supply circuitry always indicates non-failing state even during power sequencing. In addition, there is no way to actively trigger a failure state to test proper function of the monitors.

To provide the capability to trigger a self-test, primary/secondary supply inputs of primary/secondary supply monitor circuits 124-128 can be swapped to reveal a problem with one or more of interconnects 111. If all interconnects 111 are properly connected between conductive pad 112 and conductive pads 104-110, supply voltages VDD_A, VDD_B, VDD_C and VDD_D will have the same value, within an acceptable tolerance. If one or more of interconnects 111 are not properly connected between conductive pad 112 and conductive pads 104-110, one or more of supply voltages VDD_A, VDD_B, VDD_C and VDD_D with the faulty connection will have a value outside a predetermined tolerance. When the self-test mode begins, primary/secondary supply monitor circuits 124, 126, 128 switch primary and secondary inputs to a detector circuit, and the change is detected if the respective interconnects are properly connected. The failure to detect a change in the output of primary/secondary supply monitor circuits 124, 128, 126 when switching to the self-test mode can be used to send a flag or indicator of the presence of an interconnect failure, and which primary/secondary supply monitor circuit(s) 124, 126, 128 detected the failure, to a control circuit (not shown). Corrective action can be taken, such as sending out a notification, to alert an operator or user to the failure and take corrective action.

Figure 2:
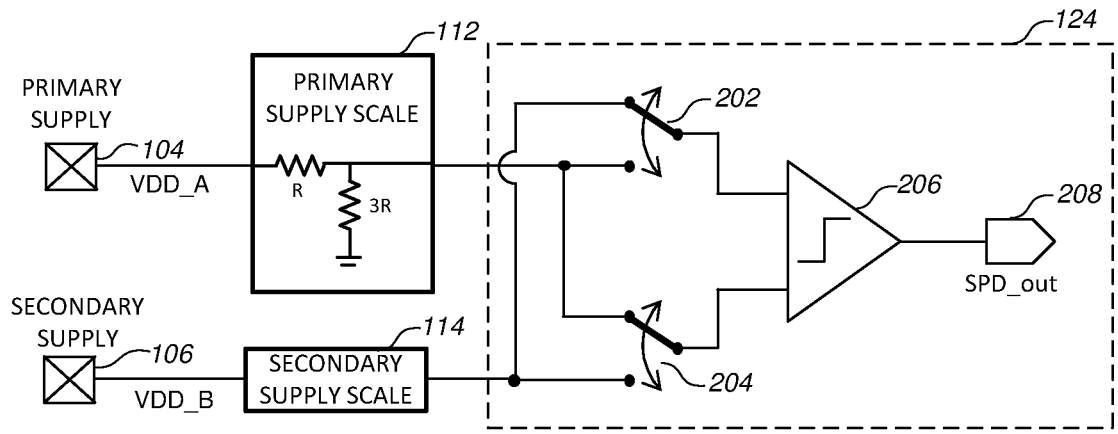
FIG. 2 illustrates a block diagram of a subset of components of the power management circuit of FIG. 1 in additional detail during a first mode of operation, according to selected embodiments.

Referring to FIGS. 1 and 2, FIG. 2 illustrates a block diagram showing additional detail of selected components of power management circuit 100 of FIG. 1 during a first, normal, mode of operation, according to selected embodiments. Primary supply scale circuit 114 includes resistive elements R and 3R. A first interconnect provides supply voltage VDD_A from conductive pad 104 to a first terminal of resistor R. A first terminal of resistor 3R in primary supply scale circuit 112 is coupled to a second terminal of resistor R and a second terminal of resistor 3R is coupled to ground. Note that the components and configuration of primary supply scale circuit 112 can be different from that shown in FIG. 2 to provide a desired level of scaling. The output of primary supply circuit 112 is provided to a first input of primary/secondary supply monitor circuit 124.

A second interconnect provides supply voltage VDD_B from conductive pad 106 to secondary supply scale circuit 114. An output of secondary supply scale circuit is provided to a second input of primary/secondary supply monitor circuit 124. The components and configuration in secondary supply scale circuit 114 are different than those in primary supply scale circuit 112. For example, secondary supply scale circuit 114 may provide no scaling of VDD_B, or a different level of scaling than primary supply scale circuit 112.

Primary/secondary supply monitor circuit 124 includes switches 202, 204, detector 206, and output terminal 208. Switch 202 can be moved between a first position to connect to the output of secondary supply scale circuit 114 during a first mode and a second position to connect to the output of primary supply scale circuit 112 during a second mode. Switch 204 can be moved between a first position to connect to the output of primary supply scale circuit 112 during the first mode and a second position to connect to the output of secondary supply scale circuit 114 during the second mode. An output terminal of switch 202 can be connected to a first input of detector 206. An output terminal of switch 204 can be connected to a second input of detector 206.

Detector 206 can be configured to determine whether the first input is within a predetermined level of the second input by subtracting the second input from the first input. During the first or normal mode of operation, as shown in FIG. 2, primary/secondary supply monitor circuit 124 can indicate no-fail status when interconnections 111 between conductive pads 102/104 and conductive pads 102/106 are functional and provide equal voltage supply levels VDD_A and VDD_B to supply scale circuits 112, 114. In this condition, primary supply scale circuit 112 provides a lower voltage to the second input of detector 206 than the voltage from secondary supply scale circuit 114 provided to the first input of detector 206. The output of detector 206 will be high when the output of secondary supply scale circuit 114 is above the output of primary supply scale circuit 112 by a predetermined amount, indicating proper operation. The predetermined amount can be based on the scaling implemented in primary supply scale circuit 112 and secondary supply scale circuit 114.

If an interconnect 111 to conductive pad 106 is broken, for example due to a broken bond wire, the output of secondary supply scale circuit 114 can be pulled to ground by the scaling circuitry, or if scaling circuitry is bypassed or not implemented in secondary supply scale circuit 114, supply voltage VDD_B is likely to be lower than supply voltage VDD_A by at least the threshold amount in detector 206. In this condition, primary supply scale circuit 112 is likely to provide a higher voltage to the second input of detector 206 than the voltage from secondary supply scale circuit 114 provided to the first input of detector 206. The output of detector 206 and at output terminal 208 will be low, which can be considered an error by primary/secondary supply monitor circuit 124.

In a situation where interconnect 111 between conductive pad 102 and conductive pad 104 is broken, and the interconnect 111 between conductive pad 102 and conductive pad 106 is functioning properly, the output of detector 206 will not indicate an error. This is because the input to the negating terminal of detector 206 will be lower than the input to the non-negating terminal of detector 206, which will indicate proper operation. In order to test power management circuit 100 when the interconnect to primary supply scale circuit 112, and even when all interconnects 111 are functioning properly, a self-test mode can be used in which the primary and secondary inputs of detector 206 are swapped, changing the output state of detector 206 to detect whether power management circuit 100 is operating correctly.

Figure 3:
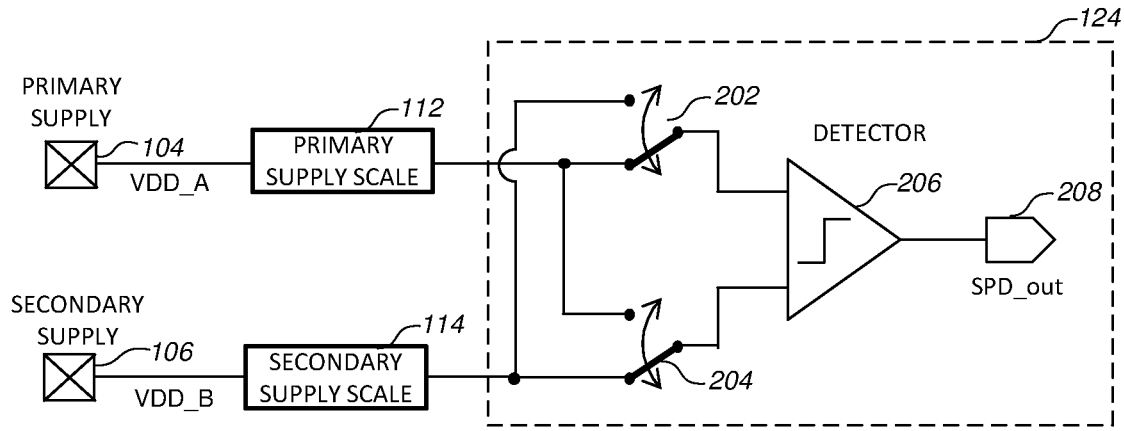
FIG. 3 illustrates a block diagram of a subset of components of the power management circuit of FIG. 1 in additional detail during a second mode of operation, according to selected embodiments.

Referring to FIGS. 1 and 3, FIG. 3 illustrates a block diagram showing additional detail of a subset of the components of power management circuit 100 of FIG. 1 during a second, self-test, mode of operation, according to selected embodiments. During the self-test mode of operation, as shown in FIG. 3, primary/secondary supply monitor circuit 124 can indicate a change in the output of detector 206 upon transition from the normal mode configuration of FIG. 2 to a self-test mode configuration of FIG. 3. When interconnections 111 between conductive pads 102/104 and conductive pads 102/106 are functional, equal voltage supply levels VDD_A and VDD_B can be provided to supply scale circuits 112, 114. Primary supply scale circuit 112 can scale VDD_A to provide a lower voltage to the first input of detector 206 than the voltage VDD_B from secondary supply scale circuit 114 provided to the second input of detector 206. The output of detector 206 will switch from high to low, indicating the signal path to power management circuit 100 is functional and primary/secondary supply monitor circuit 124 is operating properly during self-test mode.

If an interconnect 111 to conductive pad 106 is broken, for example due to a broken bond wire, the output of secondary supply scale circuit 114 can be reduced or even zero, or if scaling is being used, pulled to ground by the scaling circuitry. In this condition, primary supply scale circuit 112 provides a higher voltage to the first input of detector 206 than the voltage from secondary supply scale circuit 114 provided to the second input of detector 206. The output of detector 206 and at output terminal 208 will be high indicating an error condition during normal mode. By switching into self-test mode and observing state change at detector output, proper function of detector circuitry 206 can be proven.

The same self-test for the remaining voltage supplies VDD_C and VDD_D can be performed to determine whether interconnects 111 between conductive pad 102 and respective conductive pads 108, 110 are functioning properly. The results of the self-test for each of primary/secondary supply monitor circuits 124-128 can be analyzed by the control circuit to identify whether an problem exists with any of interconnects 111 that would prevent reliable operation of the circuitry being powered by the respective supply voltage and requires corrective action.

Figure 4:
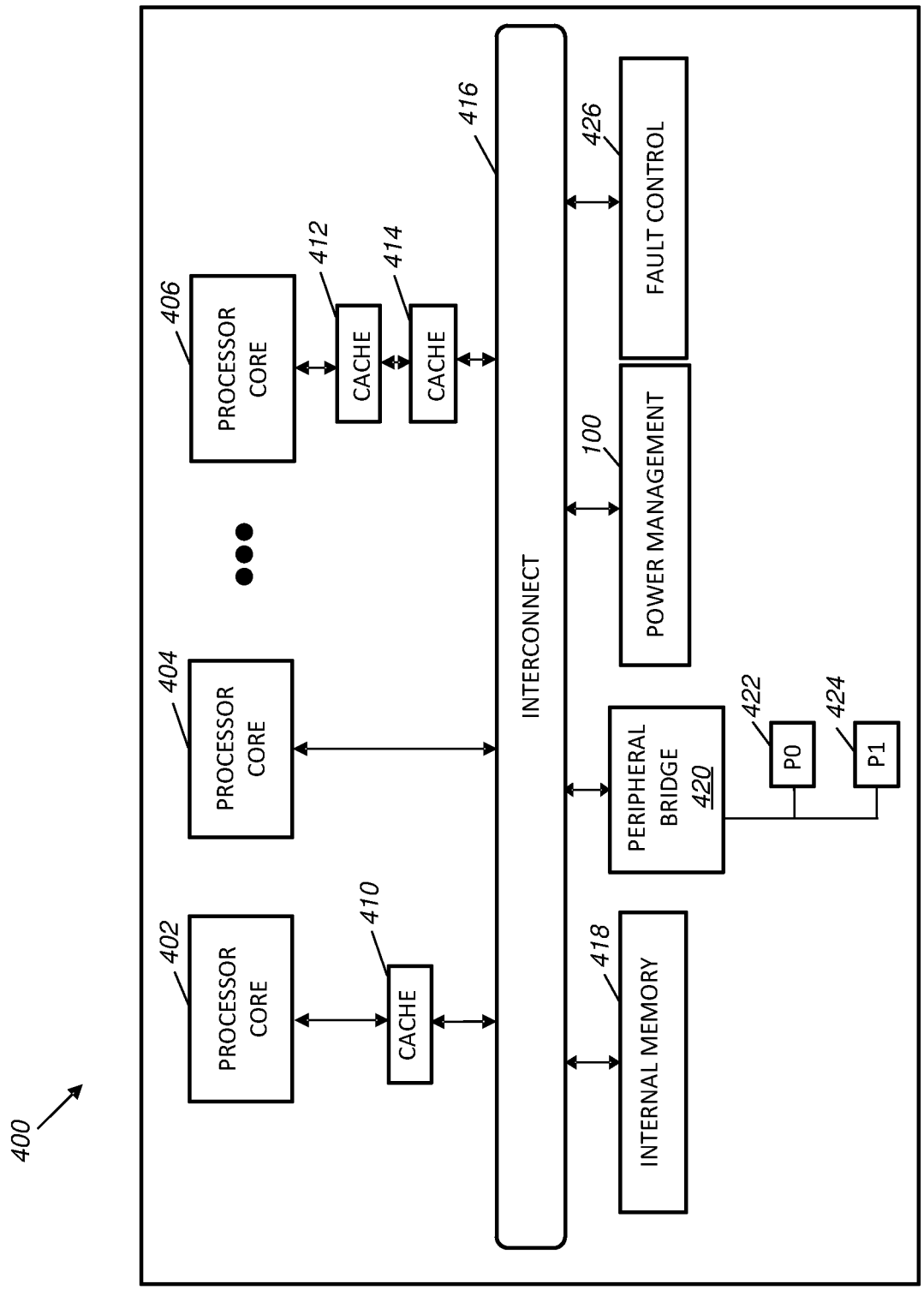
FIG. 4 illustrates a block diagram of components of a processing system in accordance with selected embodiments of the present invention.

Referring to FIG. 4, a simplified block diagram illustrating an example of a multi-core processing system (also referred to as an integrated circuit) 400 is shown that can be used to implement embodiments of the present invention. Processing system 400 can include one or more processor cores 402, 404, 406, interconnect 416, internal memory device 418, peripheral bridge 420, peripherals 422, 424, power management circuit 100, fault control circuit 426, network ports (not shown), and input/output (I/O) ports (not shown). Interconnect 416 communicatively couples all illustrated components 402-414, 418-420, 426 and 100 of processing system 400 to one another.

Processing cores 402, 404, 406 include computer processor circuitry capable of performing functions that may be implemented as software instructions, hardware circuitry, firmware, or a combination of software, hardware and firmware. Operations and functions may be performed under the control of an operating system. One or more instances of software application code may be executed at the same time. Application code being executed by processing cores 402, 404, 406 may access data and instructions in memory device 418 via interconnect 416. Processing cores 402, 404, 406 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. In addition or in the alternative, processing cores 402, 404, 406 may be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of bus master logic, such as a direct memory access controller, capable of initiating or responding to requests in processor system 400.

Processing system 400 can also include one or more network ports configurable to connect to one or more networks, which may likewise accessible to one or more remote nodes. The remote nodes can include other applications processors, devices or sensors that can exchange information with processing system 400.

Interconnect 416 routes requests and responses between processing cores 402, 400 404, 406 and power management circuit 100, peripheral bridge 420, one or more internal memory devices 418, and fault control circuit 426.

Peripheral bridge 420 are communicatively coupled to interconnect 416. Peripheral bridge 420 can include, for example, circuitry to perform power management, flash management, interconnect management, USB, and other PHY type tasks. A variety of peripheral devices 422,424 such as sensors, field programmable gate arrays, external integrated circuits, a mouse, keyboard, printer, display monitor, external memory drives, cameras, and lights, among others, can be coupled to processing system 400 via peripheral bridge 420.

Internal memory device 418 may include one or more volatile storage (or memory) devices such as random access memory (RAM), dynamic RAM (DRAM), synchronous DRAM (SDRAM), static RAM (SRAM), or other types of volatile storage devices. In addition or in the alternative, internal memory device 418 may include non-volatile memory, such as read only memory (ROM), electrically erasable programmable ROM, flash memory, magnet RAM, resistive RAM, or the like. In whatever form, internal memory device 418 may store information including sequences of instructions that are executed by the processing device or any other device. For example, executable code and/or data, in including but not limited to an operating system, device drivers, firmware (e.g., input output basic system or BIOS), and/or applications can be loaded in the memory and executed by processor cores 402, 404, 406.

Referring to FIGS. 1 and 4, power management circuit 100 can include, among other components, primary supply scale circuit 112, secondary supply scale circuits 114, 116, 118, high precision monitor circuit 122, primary/secondary supply monitor circuits 124-128, and reference generator circuit 120. Power management circuit 100 can further include logic to control switches 202, 204 during normal and self-test modes. The output of power management circuit 100, such as output from high precision monitor circuit 122 and primary/secondary supply monitor circuits 124-128 can be provided to fault control circuit 426. When a problem with supply voltage VDD_A, VDD_B, VDD_C and VDD_D for various circuitry in processing system 100 is detected due, for example, to a problem with one or more of interconnects 111, fault control circuit 426 can send an alert to notify another system component or operator of corrective action that is required to restore proper operation.

By now it should be appreciated that there has been provided a processing system with a self-test feature that may be used during production tests as well as in the field to detect when an interconnect has come loose or monitor circuits 124-128 are not operating correctly, preventing sufficient power from being supplied to one or more areas of integrated circuitry in the processing system. The self-test mode can include scaling one or more voltage supplies having the same source supply, and swapping voltage supply inputs to primary/secondary supply monitor circuits 124-128 to detect whether the supply voltages are sufficient to operate the integrated circuitry to which they are coupled. If an interconnect 111 between the source supply conductive pad 102 and conductive pads 104-108 for each supply voltage is broken, a change in the output of primary/secondary supply monitor circuits 124-128 may not occur upon transition from the normal to self-test mode, indicating a potential problem with interconnect 111 for a corresponding supply voltage(s) VDD_A, VDD_B, VDD_C and VDD_D.

In some embodiments, an integrated circuit, can comprise a first power supply terminal (104) configured to supply a first voltage, a second power supply terminal (106) configured to supply a second voltage, a first supply monitor (124) including a detector (206) having a first input and a second input, and configured to provide a fault indicator based on a comparison between the first and second inputs, and switching circuitry (202, 204) configured to during a normal operating mode, couple a voltage derived from the first voltage to the first input (e.g. bottom of 206) and a voltage derived from the second voltage to the second input (e.g. top of 206), and during a self-test mode, couple the voltage derived from the second voltage to the first input and the voltage derived from the first voltage to the second input.

In another aspect, the detector can be configured to assert the fault indicator when a voltage at the first input is greater than a voltage at the second input, and negate the fault indicator when the voltage at the first input is less than the voltage at the second input.

In another aspect the integrated circuit can further comprise a first scaling circuit (112) configured to scale the first voltage using a first scaling factor (e.g. 75%) to provide a first scaled voltage to the detector as the voltage derived from the first voltage; and a second scaling circuit (114) configured to scale the second voltage using a second scaling factor (e.g. 100%) to provide a second scaled voltage to the detector as the voltage derived from the second voltage.

In another aspect, the first scaling factor can be less than the second scaling factor.

In another aspect, the first scaling factor can be less than one and the second scaling factor is one such that the second voltage is provided unscaled as the second scaled voltage.

In another aspect, the first scaling factor can be at most 0.8.

In another aspect, the first and second power supply terminals can be configured to receive a same supply voltage from a power source external to the integrated circuit In another aspect the integrated circuit can further comprise a first subcircuit and a second subcircuit, the first power supply terminal can be configured to supply the first voltage to the first subcircuit, and the second power supply terminal can be configured to supply the second voltage to the second subcircuit.

In another aspect the integrated circuit can further comprise a precision supply monitor (122) having a first input coupled to receive the first voltage from the first power supply terminal, a second input coupled to receive a reference voltage, and an output which indicates whether the first voltage is within an expected voltage range.

In another aspect the integrated circuit can further comprise a test control circuit configured to monitor the fault indicator.

In another aspect, during the self-test mode, upon coupling the voltage derived from the second voltage to the first input and the voltage derived from the first voltage to the second input: if the fault indicator does not change state, the test control circuit can be configured to indicate a self-test fail, and if the fault indicator changes state, the test control circuit is configured to indicate a self-test pass.

In another aspect the integrated circuit can further comprise a third power supply terminal (108) configured to supply a third voltage; a second supply monitor (126) including a second detector having a first input and a second input, and configured to provide a second fault indicator based on a comparison between the first and second inputs of the second detector, and second switching circuitry configured to during the normal operating mode, couple the voltage derived from the first voltage to the first input of the second detector and a voltage derived from the third voltage to the second input of the second detector, and during the self-test mode, couple the voltage derived from the third voltage to the first input of the second detector and the voltage derived from the first voltage to the second input of the second detector.

In another embodiment, an integrated circuit can comprise a first power supply terminal configured to supply a first supply voltage to a first subcircuit; a plurality of power supply terminals each configured to supply a corresponding supply voltage to a corresponding subcircuit; a primary supply monitor having a first input coupled to receive the first supply voltage from the first power supply terminal, a second input coupled to receive a reference voltage, and an output which indicates whether the first voltage is within an expected voltage range; a plurality of secondary supply monitors, each secondary supply monitor corresponding to a power supply terminal of the plurality of power supply terminals and including: a corresponding detector having a first input and a second input, and configured to provide a corresponding fault indicator based on a comparison between the first and second inputs of the corresponding detector, and switching circuitry configured to: during a normal operating mode, couple a voltage derived from the first supply voltage to the first input of the corresponding detector and a voltage derived from the corresponding supply voltage to the second input of the corresponding detector, and during a self-test mode, couple the voltage derived from the corresponding supply voltage to the first input of the corresponding detector and the voltage derived from the first supply voltage to the second input of the corresponding detector.

In another aspect the integrated circuit can further comprise test control circuitry configured to monitor the corresponding fault indicators.

In another aspect, for each secondary supply monitor of the plurality of secondary supply monitors, during the self-test mode, upon coupling the voltage derived from the corresponding supply voltage to the first input of the corresponding detector and the voltage derived from the first voltage to the second input of the corresponding detector: if the corresponding fault indicator does not change state, the test control circuit is configured to indicate a corresponding self-test fail, and if the corresponding fault indicator changes state, the test control circuit is configured to indicate a corresponding self-test pass.

In another aspect the integrated circuit can further comprise a first scaling circuit configured to scale the first supply voltage using a first scaling factor to provide a first scaled voltage to the detector as the voltage derived from the first supply voltage; and a plurality of scaling circuits corresponding to the plurality of power supply terminals.

In another aspect, each scaling circuit of the plurality of scaling circuit can be configured to scale the corresponding supply voltage using a corresponding scaling factor to provide a corresponding scaled voltage to the corresponding detector as the voltage derived from the corresponding supply voltage.

In another aspect, the first scaling factor can be less than each of the corresponding scaling factors.

In another aspect, the first scaling factor can be at most 80%, and each of the corresponding scaling factors is at least 90%.

In another aspect, the first power supply terminal and each of the plurality of power supply terminals can be configured to receive a same supply voltage from a power source external to the integrated circuit.

In still other embodiments, an integrated circuit having a first power supply terminal (104) configured to supply a first voltage, and a second power supply terminal (106) configured to supply a second voltage, a method can comprise providing a voltage derived from the first voltage to a first input of a detector and a voltage derived from the second supply voltage to a second input of a detector, asserting a fault indicator when a voltage at the second input is greater than a voltage at the first input, otherwise, negating the fault indicator; and performing a self-test.

In another aspect, performing the self-test can comprise swapping inputs of the detector such that the voltage derived from the first voltage is provided to the second input of the detector and the voltage derived from the second supply voltage is provided to the first input of the detector, and in response to the swapping inputs of the detector, indicating a self-test pass if the fault indicator changes state and indicating a self-test fail if the fault indicator does not change state.

In another aspect the method can further comprise scaling the first voltage by a first scaling factor to provide the voltage derived from the first voltage.

In another aspect the method can further comprise scaling the second voltage by a second scaling factor to provide the voltage derived from the second voltage.

In another aspect, the first scaling factor can be less that the first scaling factor.

In another aspect, the first scaling factor can be at most 80% and the second scaling factor is at least 90%.

In another aspect the method can further comprise coupling a same power supply to each of the first and second power supply terminals.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   a first power supply terminal configured to supply a first voltage;
   a second power supply terminal configured to supply a second voltage;
   a first supply monitor including:
      a detector having a first input and a second input, and configured to provide a fault indicator based on a comparison between the first and second inputs, and
      switching circuitry configured to:
         during a normal operating mode, couple a voltage derived from the first voltage to the first input and a voltage derived from the second voltage to the second input ( ), and
         during a self-test mode, couple the voltage derived from the second voltage to the first input and the voltage derived from the first voltage to the second input.

2. The integrated circuit of claim 1, wherein the detector is configured to assert the fault indicator when a voltage at the first input is greater than a voltage at the second input, and negate the fault indicator when the voltage at the first input is less than the voltage at the second input.

3. The integrated circuit of claim 1, further comprising:
   a first scaling circuit configured to scale the first voltage using a first scaling factor to provide a first scaled voltage to the detector as the voltage derived from the first voltage; and
   a second scaling circuit configured to scale the second voltage using a second scaling factor to provide a second scaled voltage to the detector as the voltage derived from the second voltage, wherein the first scaling factor is less than the second scaling factor.

4. The integrated circuit of claim 3, wherein the first scaling factor is less than one and the second scaling factor is one such that the second voltage is provided unscaled as the second scaled voltage.

5. The integrated circuit of claim 3, wherein the first scaling factor is at most 0.8.

6. The integrated circuit of claim 1, wherein the first and second power supply terminals are configured to receive a same supply voltage from a power source external to the integrated circuit.

7. The integrated circuit of claim 1, further comprising a first subcircuit and a second subcircuit, wherein the first power supply terminal is configured to supply the first voltage to the first subcircuit, and the second power supply terminal is configured to supply the second voltage to the second subcircuit.

8. The integrated circuit of claim 7, further comprising a precision supply monitor having a first input coupled to receive the first voltage from the first power supply terminal, a second input coupled to receive a reference voltage, and an output which indicates whether the first voltage is within an expected voltage range.

9. The integrated circuit of claim 1, further comprising a test control circuit configured to monitor the fault indicator, wherein during the self-test mode, upon coupling the voltage derived from the second voltage to the first input and the voltage derived from the first voltage to the second input:
   if the fault indicator does not change state, the test control circuit is configured to indicate a self-test fail, and
   if the fault indicator changes state, the test control circuit is configured to indicate a self-test pass.

10. The integrated circuit of claim 1, further comprising:
   a third power supply terminal configured to supply a third voltage;
   a second supply monitor including:
      a second detector having a first input and a second input, and configured to provide a second fault indicator based on a comparison between the first and second inputs of the second detector, and
      second switching circuitry configured to:
         during the normal operating mode, couple the voltage derived from the first voltage to the first input of the second detector and a voltage derived from the third voltage to the second input of the second detector, and
         during the self-test mode, couple the voltage derived from the third voltage to the first input of the second detector and the voltage derived from the first voltage to the second input of the second detector.

11. An integrated circuit, comprising:
   a first power supply terminal configured to supply a first supply voltage to a first subcircuit;
   a plurality of power supply terminals each configured to supply a corresponding supply voltage to a corresponding subcircuit;
   a primary supply monitor having a first input coupled to receive the first supply voltage from the first power supply terminal, a second input coupled to receive a reference voltage, and an output which indicates whether the first voltage is within an expected voltage range;
   a plurality of secondary supply monitors, each secondary supply monitor corresponding to a power supply terminal of the plurality of power supply terminals and including:
      a corresponding detector having a first input and a second input, and configured to provide a corresponding fault indicator based on a comparison between the first and second inputs of the corresponding detector, and
      switching circuitry configured to:
         during a normal operating mode, couple a voltage derived from the first supply voltage to the first input of the corresponding detector and a voltage derived from the corresponding supply voltage to the second input of the corresponding detector, and
         during a self-test mode, couple the voltage derived from the corresponding supply voltage to the first input of the corresponding detector and the voltage derived from the first supply voltage to the second input of the corresponding detector.

12. The integrated circuit of claim 11, further comprising:
test control circuitry configured to monitor the corresponding fault indicators, wherein, for each secondary supply monitor of the plurality of secondary supply monitors, during the self-test mode, upon coupling the voltage derived from the corresponding supply voltage to the first input of the corresponding detector and the voltage derived from the first voltage to the second input of the corresponding detector:
- if the corresponding fault indicator does not change state, the test control circuit is configured to indicate a corresponding self-test fail, and
- if the corresponding fault indicator changes state, the test control circuit is configured to indicate a corresponding self-test pass.

13. The integrated circuit of claim 11, further comprising:
a first scaling circuit configured to scale the first supply voltage using a first scaling factor to provide a first scaled voltage to the detector as the voltage derived from the first supply voltage; and
a plurality of scaling circuits corresponding to the plurality of power supply terminals, wherein each scaling circuit of the plurality of scaling circuits is configured to scale the corresponding supply voltage using a corresponding scaling factor to provide a corresponding scaled voltage to the corresponding detector as the voltage derived from the corresponding supply voltage, wherein the first scaling factor is less than each of the corresponding scaling factors.

14. The integrated circuit of claim 13, wherein the first scaling factor is at most 80%, and each of the corresponding scaling factors is at least 90%.

15. The integrated circuit of claim 11, wherein the first power supply terminal and each of the plurality of power supply terminals are configured to receive a same supply voltage from a power source external to the integrated circuit.

16. A method, in an integrated circuit having a first power supply terminal configured to supply a first voltage, and a second power supply terminal configured to supply a second voltage, the method comprising:
providing a voltage derived from the first voltage to a first input of a detector and a voltage derived from the second supply voltage to a second input of a detector;
asserting a fault indicator when a voltage at the second input is greater than a voltage at the first input, otherwise, negating the fault indicator; and
performing a self-test, wherein performing the self-test comprises:
- swapping inputs of the detector such that the voltage derived from the first voltage is provided to the second input of the detector and the voltage derived from the second supply voltage is provided to the first input of the detector, and
- in response to the swapping inputs of the detector, indicating a self-test pass if the fault indicator changes state and indicating a self-test fail if the fault indicator does not change state.

17. The method of claim 16, further comprising:
scaling the first voltage by a first scaling factor to provide the voltage derived from the first voltage.

18. The method of claim 17, further comprising:
scaling the second voltage by a second scaling factor to provide the voltage derived from the second voltage, wherein the first scaling factor is less that the first scaling factor.

19. The method of claim 18, wherein the first scaling factor is at most 80% and the second scaling factor is at least 90%.

20. The method of claim 16, further comprising coupling a same power supply to each of the first and second power supply terminals.

* * * * *